United States Patent [19]

Moslehi

[11] Patent Number: 5,156,994
[45] Date of Patent: Oct. 20, 1992

[54] LOCAL INTERCONNECT METHOD AND STRUCTURE

[75] Inventor: Mehrdad M. Moslehi, Dallas, Tex.

[73] Assignee: Texas Instruments Incorporated, Dallas, Tex.

[21] Appl. No.: 634,272

[22] Filed: Dec. 21, 1990

[51] Int. Cl.⁵ ............................................. H01L 21/20
[52] U.S. Cl. ...................................... 437/89; 437/21; 437/41; 437/200; 437/192; 437/193
[58] Field of Search ................. 437/89, 228, 200, 41, 437/21, 22, 192, 193

[56] References Cited

U.S. PATENT DOCUMENTS

| 4,102,733 | 7/1978 | De La Moneda et al. | 148/DIG. 147 |
| 4,822,749 | 4/1989 | Flanner et al. | 437/200 |
| 4,868,618 | 9/1989 | Kalnitsky et al. | 357/23.12 |
| 4,873,204 | 10/1989 | Wong et al. | 437/200 |
| 5,001,082 | 3/1991 | Goodwin-Johansson | 437/41 |

FOREIGN PATENT DOCUMENTS 0031114 2/1987 Japan.

Primary Examiner—Brian E. Hearn
Assistant Examiner—Trung Dang
Attorney, Agent, or Firm—Ira S. Matsil; B. Peter Barndt; Richard L. Donaldson

[57] ABSTRACT

An improved local electrical interconnect device fabrication and method are provided. Reacted refractory metal contacts and local interconnect lines (54) and (56) are formed by reacting a deposited refractory metal layer (53) with selectively grown semiconductor regions (48) and (50). Regions (48) and (50) are formed after a masked ion implantation which forms loosely bonded surface regions (44) and (46) within field insulating regions (12). As a result of the ion implantation, semiconductor regions (48a) and (50a) are able to form over field insulating regions (12).

28 Claims, 6 Drawing Sheets

LOCAL INTERCONNECT METHOD AND STRUCTURE

TECHNICAL FIELD OF THE INVENTION

This invention relates in general to microelectronic devices and integrated circuits, and more particularly to a fabrication method and structure involving local interconnection of semiconductor devices.

BACKGROUND OF THE INVENTION

In modern integrated circuit technologies, numerous interconnect fabrication methodologies have been provided in order to interconnect integrated circuit devices. More particularly, some local interconnect methods have been implemented in the construction of very large scale integration (VLSI) and ultra large scale integration (ULSI) circuit environments. A specific concern in fabrication of VLSI and ULSI circuits has been the methods used to interconnect devices which are local to one another. A relevant example is efficient interconnection of the transistors in the memory cells of the static random access memory (SRAM) chips for reduced cell layout area. One current device interconnection method suffers inefficiencies by requiring numerous process steps and wasting excess unreacted refractory metal (and/or metal nitride) materials. An alternative known method based on the refractory metal nitride local interconnect technology can reduce the chip size but can be problematic because it utilizes interconnecting materials such as refractory metal nitrides which usually have a high electrical resistivity. The metal nitride local interconnect technology reduces the overall circuit speed and limits the maximum distance over which the interconnect may extend. Both of these methods also rely on complex fabrication processes which may cause process reproducibility and manufacturing yield degradation problems.

A first type of interconnection scheme existing in the prior art involves forming self-aligned refractory metal silicide contacts on a device while discarding, and therefore wasting, any excess material (either reacted metal nitride or unreacted) which extends over the insulating regions beyond the dimensions of the active device area. Additionally, a selective etch must be utilized in order to remove areas of unreacted metal and/or reacted metal nitride material. Further, this etch must be highly selective to prevent etching of reacted metal silicide and surrounding insulator layers. Thereafter, an interlevel dielectric is deposited over the device and contact holes are formed therein using standard photolighographic and etch processes. Finally, a metal layer (e.g. tungsten or aluminum) is deposited thereby forming electrical contacts between the top metal layer and the refractory metal silicide contacts . previously formed. A barrier layer such as sputtered or chemical-vapor-deposited titanium nitride may be used between the reacted silicide and top metal layers in order to improve the metallization reliability.

A second type of interconnection scheme known in the art involves forming self-aligned refractory metal silicide contacts on the device and retaining the selected portions of reacted refractory metal nitride (and/or unreacted refractory metal) material which are formed during refractory metal silicide formation process, and which extend over the insulator surfaces beyond the active dimensions of the interconnected device. This interconnection technique employs a microlithographic masking step and a subsequent selective anisotropic etch to form a specified pattern and maintain selected portions of the refractory material not converted to silicide. These selected portions, usually made of refractory metal nitrides, are thereafter used as local interconnects; however these portions have a high electrical resistivity because they have not reacted with a semiconductor material as have the silicide contacts on the active devices. This high resistivity material can limit the practical maximum interconnect length and efficiency of this type of local interconnect, particularly in the scaled submicron-technologies.

Therefore, a need has arisen for a method and structure involving the interconnection of semiconductor devices, which optimizes the local interconnection method and process and eliminates the problems identified above.

SUMMARY OF THE INVENTION

In accordance with the present invention, a method and structure involving interconnection of semiconductor devices are provided which substantially eliminate or reduce disadvantages and problems associated with related prior art methodologies and structures.

The present invention includes a method of forming an interconnect layer over a substrate including semiconductor devices and a field insulating layer. The method includes the step of covering selected regions of the semiconductor wafer with a mask such that an area where the local interconnect is to be formed is exposed. Subsequently, suitable ions are implanted into the exposed surface area. Thereafter, a semiconductor interconnect layer is formed in the exposed patterned area. Finally, a reacted refractory metal contact is formed in the exposed patterned area.

The methodologies and structure associated with the present invention give rise to numerous technical advantages. One technical advantage of the present invention is the provision of low electrical resistance, reacted refractory metal interconnection lines which replace higher resistance refractory metal nitride materials previously used for local interconnects. The provision of a lower resistance interconnect gives rise to the additional technical advantages of increased device speed and reduced chip power consumption. Additionally, the provision of a reacted refractory metal interconnect reduces the metal-to-local interconnect contact resistance. An additional technical advantage is the allowance of reacted refractory metal interconnection and low-resistance device contacts over field insulating regions. Still another technical advantage of the present invention is an increased compatibility with selective refractory metal processes used to form planar structures by filling contact via holes. In particular, there is the technical advantage that the reacted refractory metal is preferred over substance such as metal nitrides in order to optimize selective refractory metal nucleation and deposition. Still another technical advantage of the present invention is the reduced processing complexity and enhanced device fabrication process latitude. Particularly, there is a technical advantage that an isotropic etch may be used to remove excess refractory metal nitride and unreacted metal with reasonable etch selectivity with respect to reacted silicide. An additional technical advantage is a significant reduction in local interconnect etch undercut due to the provision of an isotropic and highly selective etch process. Still another technical advantage of the present invention is the selective removal of unreacted refractory metal and reacted refractory metal nitride materials with the use of a blanket isotropic etch without the presence of a photoresist pattern mask as required by the prior art. This feature simplifies the development of a reliable dry (e.g. plasma or photochemical) etch process to remove the excess non-silicide, refractory materials.

BRIEF DESCRIPTION OF THE DRAWINGS

For a more complete understanding of the present invention and the advantages thereof, reference is now made to the following detailed description taken in conjunction with the accompanying drawings, in which.

DETAILED DESCRIPTION OF THE INVENTION

The preferred embodiments of the present invention are illustrated in FIGS. 1-19 of the drawings, like numerals being used to refer to like and corresponding parts of the various drawings.

Figure 1:
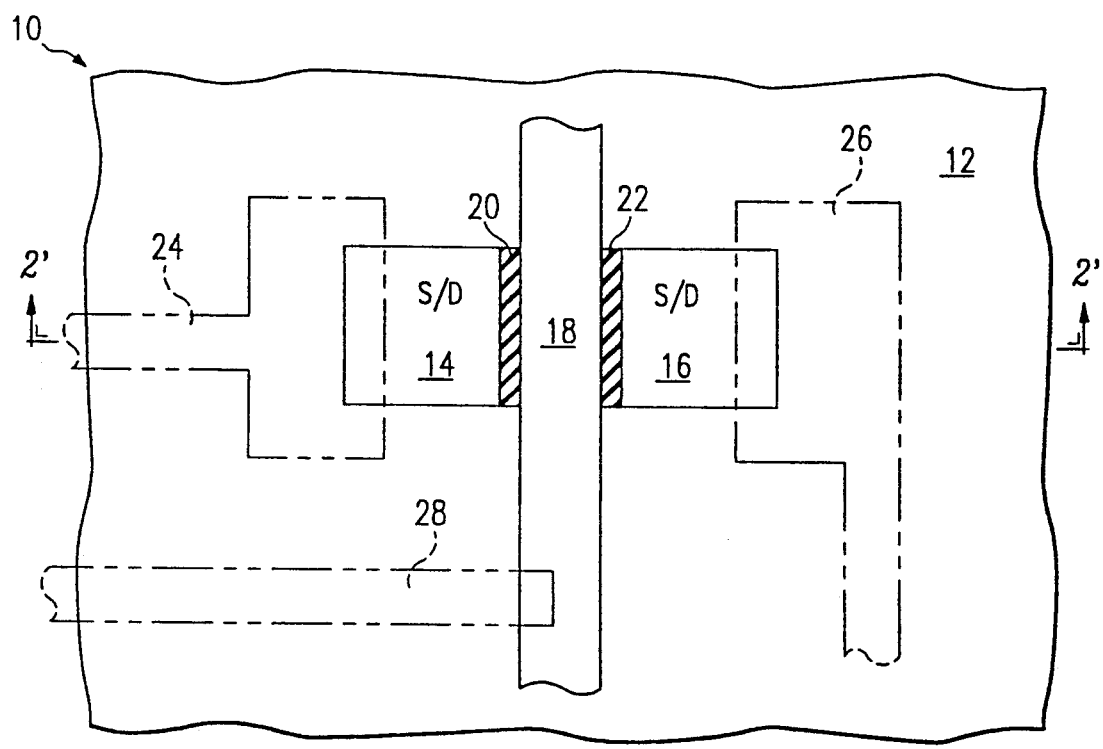
FIG. 1 illustrates a plan view of a semiconductor layout having regions where it is desired to construct conductive device interconnect segments.

FIG. 1 illustrates a plan view of a semiconductor device layout indicated generally at 10. Semiconductor device layout 10 includes a field insulating region 12, which typically comprises an oxide material. Implanted within semiconductor layout 10 are source/drain junction regions 14 and 16. A gate conductor 18 overlies source/drain junction regions 14 and 16 and is separated therefrom by respective sidewall spacers 20 and 22. Three additional interconnect regions 24, 26 and 28 are illustrated in FIG. 1 by dashed lines. Interconnect regions 24, 26 and 28 depict the areas in which it is desired to form an electrical interconnecting material such that local electrical contact may be subsequently made to the source/drain junctions and gate electrode regions. In particular, an interconnect formed in interconnect region 24 will provide electrical connections to source/drain junction region 14. Similarly, an interconnect formed in interconnect region 26 will allow electrical connection to source/drain junction 16 while an interconnect formed in interconnect region 28 will permit electrical contact to gate conductor 18.

Figure 2:
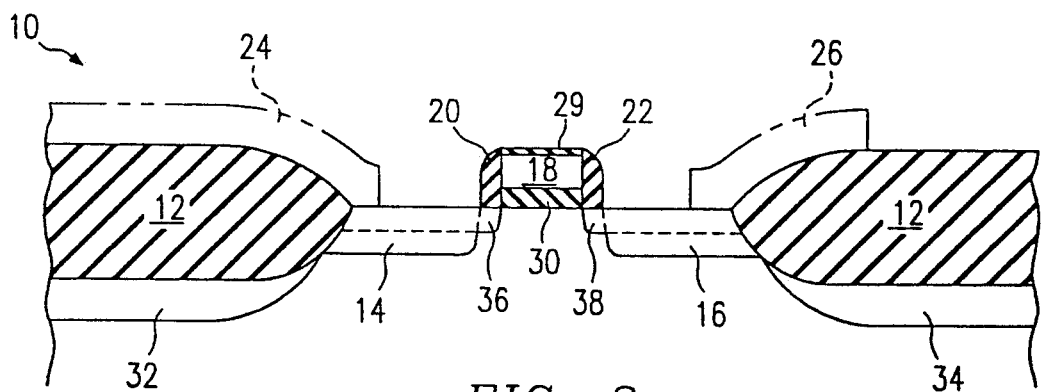
FIG. 2 illustrates a cross-sectional view of the semiconductor layout of FIG. 1, including the general structure of an insulated-gate field-effect transistor (IGFET) device included within the semiconductor layout.

FIG. 2 illustrates a cross-sectional view of FIG. 1 along line 2, From the perspective illustrated in FIG. 2, it may be appreciated that semiconductor layout 10 includes a transistor device (IGFET) having a gate conductor 18 operable to cause a conductive current path between source/drain junction regions 14 and 16. A thin dielectric pad 29, preferably of silicon nitride, overlies gate conductor 18. The transistor structure further includes a gate insulator 30. For purposes of illustrating a typical contemporary transistor device, FIG. 2 further includes p channel stop regions 32 and 34 along with LDD (lightly-doped drain) source/drain junction regions 36 and 38. It should be noted that the various components of the transistor structure within semiconductor layout 10 are shown simply for illustrative purposes. The interconnection methodology and structure provided with the present invention may be implemented with any alternative type of transistor structure or additionally, may be implemented with any type of semiconductor device to which it is desired to provide an electrical interconnect. Again in FIG. 2, interconnect regions 24 and 26 are shown in dashed lines to indicate areas where it is desirable to construct an interconnecting material. FIGS. 3 through 7 illustrate the preferred and numerous techniques for forming interconnecting materials in the desired regions 24, 26 and 28.

Figure 3:
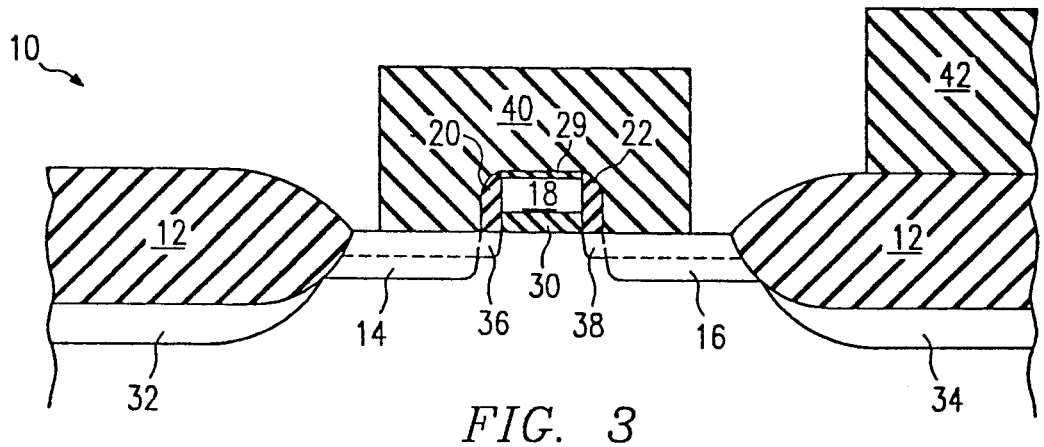
FIG. 3 illustrates a cross-sectional view of the transistor structure having patterned local interconnect photoresist mask, or hard mask, thereon for masked ion implantation.

FIG. 3 illustrates a cross-sectional view of semiconductor device layout 10 during the initial step of forming the desired interconnect regions. Mask structures 40 and 42 are formed to cover the transistor device except in areas where it is desired to form electrical interconnect regions. Mask structures 40 and 42 are preferably formed in one of two ways, including: (1) photoresist masking; or (2) hard mask (e.g. doped oxide) formation.

In the first alternative, mask structures 40 and 42 may be formed using photoresist patterning techniques. In particular, a photoresist material is spun on to semiconductor device layout 10. Thereafter, an interconnect pattern is formed on the photoresist material after masked exposure of the semiconductor layout 10 to an ultraviolet light and a subsequent development, which removes the photoresist in areas where an interconnect pattern is desired. Finally, a photoresist pattern is formed which contains a negative image of the desired interconnect pattern.

As a second alternative for implementing mask structures 40 and 42, a hard mask process may be used. In particular, a doped oxide layer such as PSG, BSG or BPSG is deposited as a blanket hard mask film over the entire semiconductor device layout 10. The thickness of the hard mask layer is typically on the order of 500 to 2,000 angstroms. A photoresist material is then deposited, typically by a spin-on technique, over the entire blanket hard mask. A photoresist pattern which covers all areas where interconnects are not to be formed, is formed in the photoresist material. This is performed by masked exposure of semiconductor device layout 10 to an ultraviolet light source and a subsequent resist development, thereby removing the photoresist overlying the blanket hard mask in areas where the photoresist is exposed to the ultraviolet light (assuming that a positive photoresist material is used). The interconnect pattern is formed within the photoresist film as a negative image of the desired interconnect pattern. The blanket hard mask is then etched away where it is not protected by the patterned photoresist mask. Finally, the photoresist is removed thereby leaving patterned hard mask regions as mask structures 40 and 42 as shown in FIG. 3. The hard mask pattern is a negative image of the desired interconnect pattern.

Figure 4:
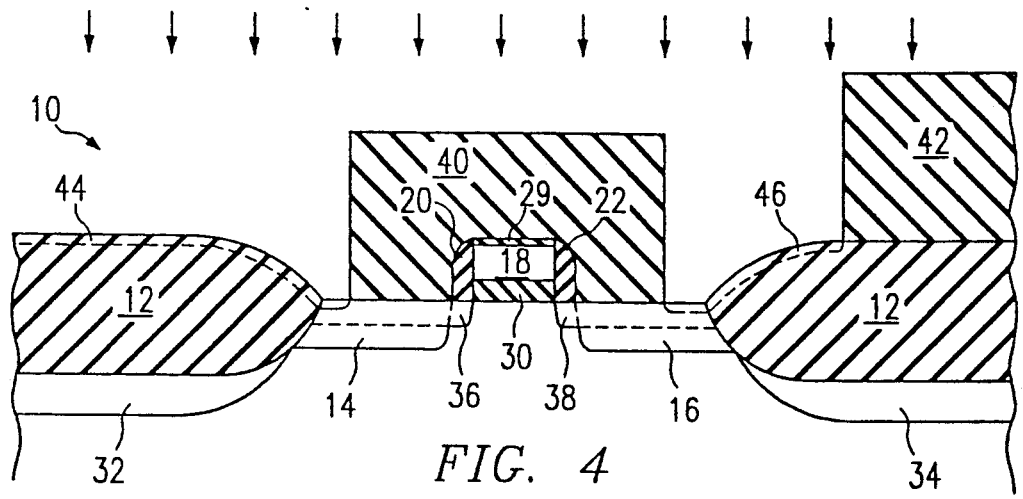
FIG. 4 illustrates a cross-sectional view of the transistor and overlying masks being subjected to an ion implantation process.

FIG. 4 illustrates a cross-sectional view of semiconductor device layout 10 following the low-energy. implantation of semiconductor ions. The implantation is preferably of silicon or germanium ions at a dosage of 1E13 to 1E16/cm$^2$, and at an energy level less than 50 keV. An alternative ion implantation process may implant inert species such as argon, helium, or xenon instead of silicon or germanium. Other types of elements such as dopant atoms may also be used.

The implantation of ions has two effects. First, the implantation causes some surface damage over field insulating regions 12. In particular, field insulating regions 12 are modified at their surface because the low-energy implanted ions (silicon, argon, helium, or germanium; preferably germanium) break the Si-O bonds at the surface and cause surface damage. The reference to "surface damage" is an indication that the molecular structure of the oxide lattice molecules near the surface of insulating region 12 is broken or disturbed, thereby breaking the bonds of semiconductor atoms and freeing them for promoting subsequent selective growth nucleation as discussed below.

The second effect of the light ion implantation is that the implanted Si or Ge atoms are deposited near the unmasked implanted surface regions and provide additional unbonded (or loosely bonded) semiconductor atoms. These implanted atoms define loosely bonded atom regions 44 and 46. Regions 44 and 46 therefore are rich in semiconductor atoms due to the low-energy ion implantation process.

As mentioned above, an alternative to implantation of semiconductor atoms such as silicon or germanium is an implantation utilizing an inert species such as argon helium, or xenon. The inert species, however, will only provide the first of the two effects mentioned above in discussion with the implantation of silicon or germanium. Thus, the use of an inert species implantation will break molecular bonding near the surface of insulating region 12 thereby making unbonded or loosely bonded semiconductor atoms available for subsequent nucleation as discussed below.

Figure 5:
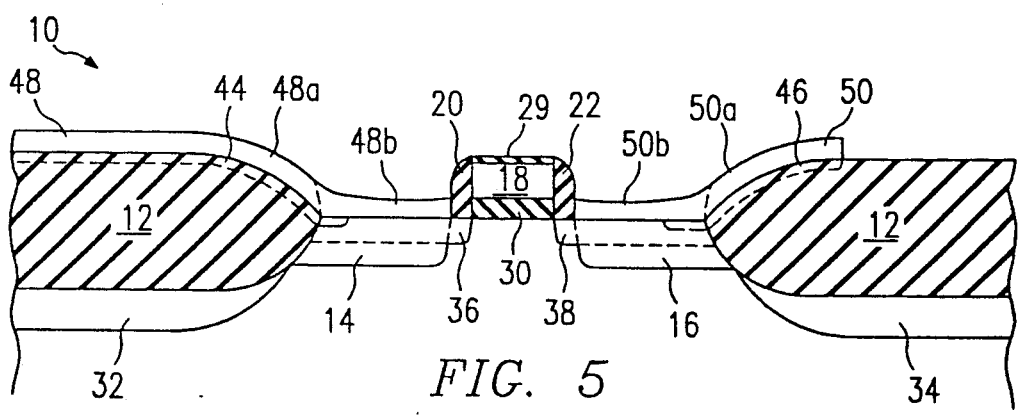
FIG. 5 illustrates a cross-sectional view of the transistor after removal of the ion implantation mask and following a selective semiconductor growth (SSG) process.

FIG. 5 illustrates a cross-sectional view of semiconductor device layout 10 following the formation of semiconductor interconnect segments 48 and 50. For purposes explained below, interconnect segments 48 and 50 are illustrated as each including two separate regions, designated 48a and 48b, and 50a and 50b. The format of these regions is as follows. Mask structures 40 and 42 are stripped after the ion implantation process. A selective semiconductor growth (SSG) of undoped or doped semiconductor material is performed. The SSG forms semiconductor regions 48a and 50a over implanted surface regions with loosely bonded surface molecular layers 44 and 46, respectively, and also forms semiconductor regions 48b and 50b over the exposed semiconductor portions of implanted source/drain junction regions 14 and 16, respectively. The SSG also forms gate conductor extension (not shown in FIG. 5) connected to gate conductor 18. Preferably, the SSG deposited semiconductor material is amorphous silicon or polysilicon or silicon-germanium alloy or amorphous/polycrystalline germanium.

The SSG process may be performed in an epitaxial semiconductor growth reactor using a selective deposition process chemistry such as SiH$_2$Cl$_2$ (DCS) with HCl and H$_2$ for selective silicon deposition. Germane (GeH$_4$) or a mixture of germane plus DCS may be used as the semiconductor source gas for selective deposition of germanium or silicon-germanium, respectively. As a result of the SSG process, there is a self-aligned selective deposition of undoped silicon (or another semiconductor layer), thereby forming interconnect segments 48 and 50, as well as gate conductor extension 52, each typically on the order of 500 to 4000 angstroms in thickness. In the current example, silicon is the selectively grown semiconductor material because the material underlying interconnect segments 48 and 50, as well as gate conductor extension 52, is also silicon. It should be understood, however, that alternative semiconductor materials (e.g. germanium or germanium-silicon) may be grown in accordance with silicon substrates or alternative types of underlying semiconductor materials.

It should be noted that the quality of the silicon layer deposited by the SSG process is not a critical factor which will affect device performance. The SSG may be either amorphous or polycrystalline silicon. The type of semiconductor material layer deposited on various parts of a patterned semiconductor substrate depend on various factors such as surface morphology, surface defects, and the type of underlying layer. For instance, the polycrystalline nature of gate conductor 18 and the amorphous structure of field insulating region 12 will ensure that the SSG formed overlying material for gate conductor extension 52 will be either amorphous or polycrystalline. However, implanted source/drain junction regions 14 and 16 are single-crystal and, as a result, the SSG process parameters and silicon surface characteristics will determine the type of silicon material layer deposited in regions 48b and 50b (single-crystal, polycrystalline, or amorphous). The SSG process parameters are optimized in order to eliminate any pattern-dependent kinetics (i.e. microloading) effects and sidewall faceting. These considerations usually imply that the SSG process should be performed in the kinetic-limited or reacting-limited deposition regions (e.g. at $T \leq 900°$ C. and low pressures).

The SSG layer may be deposited as undoped silicon, and subsequently, ion implanted either before or after the formation of self-aligned reacted refractory metal (e.g. silicide) regions as discussed below. The subsequent doping may be accomplished by performing an n+ (e.g. arsenic or phosphorus) ion implantation on the order of 1E15 to $1E16/cm^2$ at an energy level of 40 to 100 keV (for NMOS devices). Thereafter, the device is annealed by a rapid thermal anneal (RTA), for instance, at 1000° C. for 15 to 100 seconds. An in-situ doping process at a level on the order of 5E18 to $5E21/cm^3$, and preferably at $5E20/cm^3$, may be used as an alternative to depositing undoped silicon. The choice of in-situ doping during the SSG process or ion implantation doping depends on various process considerations. If the source/drain junction regions are doped prior to the SSG process, an ion implantation step to dope the SSG layer will not be essential. This is due to the fact that a subjected silidation process can consume the entire SSG layer.

From the above, it may be appreciated that interconnecting semiconductor regions may be formed overlying both ion implanted regions within insulating areas and pre-existing semiconductor regions. In particular, these interconnecting regions have been shown to have been formed in the desired interconnecting regions 24 and 26 discussed above in connection with FIG. 2. These interconnecting semiconductor regions may be subsequently reacted to form reacted refractory metal (e.g. silicide) interconnect regions, thereby providing an available electrically conductive interconnection to different areas within semiconductor device layout 10 as described in greater detail below. Thus, by using a proper interconnection mask pattern, this process will result in formation of semiconductor interconnect segments 48 and 50 which may be subsequently reacted with a refractory metal to provide connections directly to the source, drain, and/or gate electrode regions of the device, or wherever else connection may be needed.

Figure 5A:
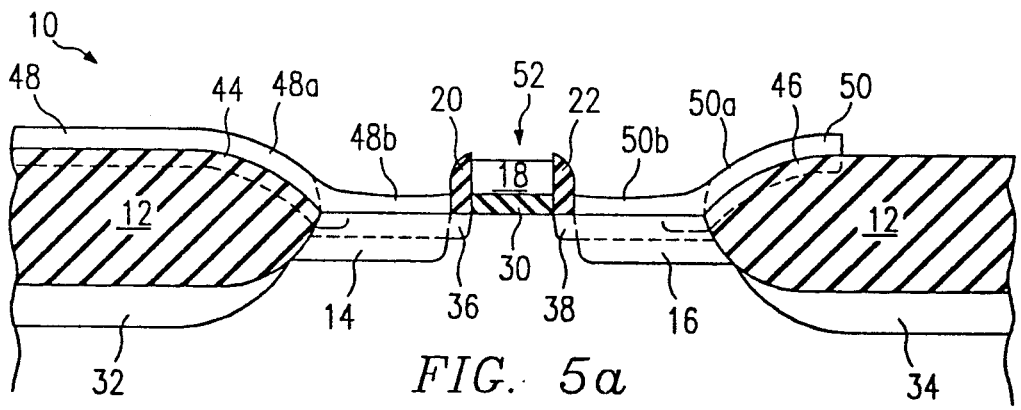
FIG. 5a illustrates a cross-sectional view of the transistor following removal of the dielectric pad layer on the top of gate electrode.

FIG. 5a illustrates a cross-sectional view of semiconductor device layout 10 following the removal of dielectric pad 29. The dielectric pad 29 over gate conductor 18 prevents semiconductor deposition over the gate region during the SSG process. Dielectric pad 29 is removed after the SSG process with an etchant selective to the material of which dielectric pad is made (silicon nitride in the preferred embodiment). The removal of dielectric pad 29 creates a cavity 52 overlying gate conductor 18 and between sidewall spacers 20 and 22.

Figure 6:
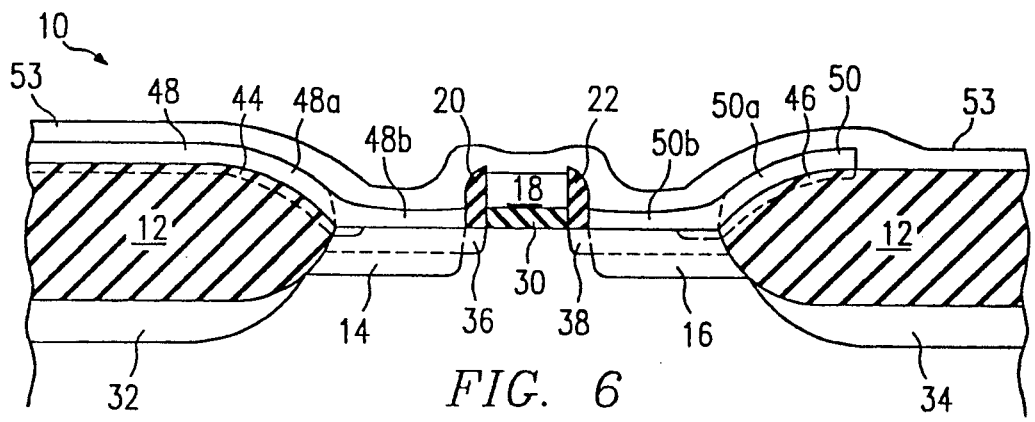
FIG. 6 illustrates a cross-sectional view of the transistor following a blanket sputter deposition of a refractory metal layer (e.g. by sputter deposition)

FIG. 6 illustrates a cross-sectional view of semiconductor layout of FIG. 5a after a blanket deposition of a refractory metal layer 53 (for instance, by sputter deposition) and before the annealing process. In the preferred embodiment, refractory metal layer 53 is titanium; however, it should be understood that alternative refractory metal layers may be used in lieu thereof. Refractory metal layer 53 may be reacted as discussed below in order to provide contact to selected regions of semiconductor device layout 10.

Figure 7:
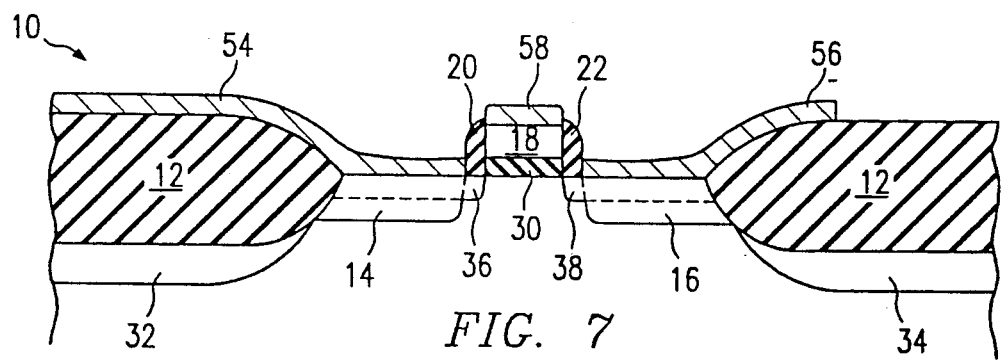
FIG. 7 illustrates a cross-sectional view of the transistor having low-resistance reacted refractory metal local interconnect segments extending over the field insulating regions.

FIG. 7 illustrates a cross-sectional view of semiconductor layout after the formation of reacted refractory metal contacts and interconnects 54, 56 and 58. Reacted refractory metal contacts and interconnects 54, 56 and 58 are formed by a reaction of refractory metal layer 53 with previously existing semiconductor interconnect segments 48 and 50, and gate conductor 18, respectively. Typically, reacted refractory metal contacts and interconnects 54, 56 and 58 are on the order of 1000 to 3000 angstroms in thickness. Reacted refractory metal contacts and interconnects 54, 56 and 58 are preferably formed by a self-aligned silicide or "SALICIDE" process which involves an RTA or furnace anneal in a nitrogen or ammonia ambient following the above discussed metal sputter deposition. The RTA forms refractory metal silicide contacts and interconnects due to the reaction, and consumption, of titanium with the underlying exposed semiconductor (i.e., silicon in the example).

Reacted refractory metal nitride (formed over the insulating regions) and some unreacted refractory metal (not shown) are left over the insulating surfaces, including field insulating regions 12 and sidewall spacers 20 and 22. After the initial RTA, both unreacted titanium and reacted titanium nitride (not shown) may be selectively etched and removed with a plasma and/or wet etch process. This etch may be an isotropic etch with selectivity against silicide (the reacted refractory metal), and therefore, there is reduced undercut over the prior art use of an anisotropic etch to remove these materials. Thereafter, a second RTA may be performed in order to cause reacted refractory metal contacts and interconnects 54, 56 and 58 to have a lesser electrical resistivity (and also complete stoichiomatic silicide formation over gate and source/drain junction regions as well as in the local interconnect lines).

The present example specifies a silicide material which is the reaction product of the refractory metal with the underlying silicon. It should be noted, however, that reacted refractory metal contacts and interconnects 54, 56 and 58 may comprise alternative reactive products where a refractory metal reacts with other types of alternative semiconductor materials (e.g. silicon-germanium). It should also be noted that source/drain junction contacts 54 and 56 of the transistor structure illustrated in FIG. 7 form elevated source/drain junction regions for the transistor. The elevated source/drain junction feature allows formation of low-leakage ultrashallow junctions.

Returning to FIG. 1, it may be appreciated that the same novel techniques hereinabove described for creating a reacted refractory metal contact may also be used to form the same in region 28 which was previously described as an area where it is desired to construct a conductive interconnect. Thus, from the above, it may be appreciated that the present invention provides a novel improved interconnect scheme for use with semiconductor devices or layouts. The reacted refractory metal interconnects provide a low resistance electrical contact to the areas to which they interconnect. Further, additional "plug" contacts may be formed to connect the reacted refractory metal contact to other metal lines in upper metallization levels. The contact resistance arising from this connection will also be reduced due to the provision of reacted refractory metal contacts in accordance with the invention as described.

As mentioned above, FIGS. 2 through 7 illustrate a method for forming reacted refractory metal contacts and local interconnects to a transistor. The contacts and local interconnects have ultimately been shown to result in a transistor having elevated source/drain junction regions. The following discussion of FIGS. 8 through 13, however, illustrate an alternative use of the present invention to form contact and local interconnect regions while constructing a traditional transistor structure without elevated source/drain junction regions. It should be noted that the following discussion will use like reference numerals to those used in FIGS. 1 through 7, except where component features are different than those illustrated in FIGS. 1 through 7.

Figure 8:
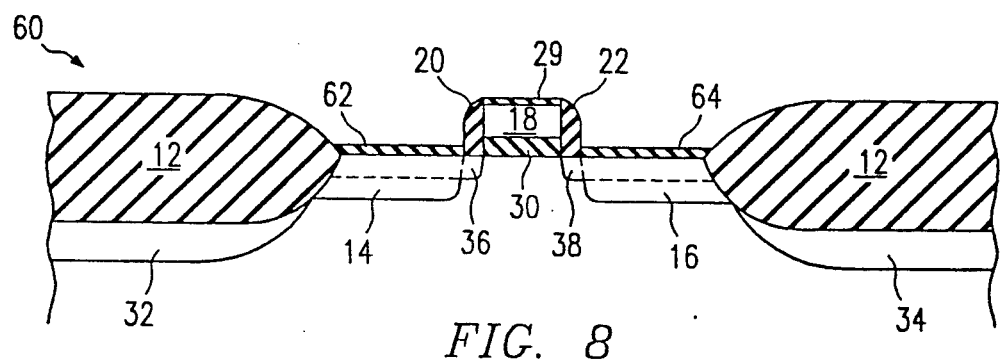
FIG. 8 illustrates a cross-sectional view of a transistor structure having sacrificial insulating layers formed over the implanted source/drain junction regions.

FIG. 8 illustrates a cross-sectional view of a transistor structure indicated generally at 60. Transistor structure 60 includes a transistor device having a gate 18 operable to cause a conductive channel current path to form between source/drain junction regions 14 and 16. A thin dielectric pad 29, preferably of silicon nitride, overlies gate conductor 18 (formed along with the gate conductor 18 patterning process). Transistor structure 60 of FIG. 8, like that of FIG. 2, further includes p type channel stop regions 32 and 34 along with LDD source/drain junction regions 36 and 38. Sacrificial layers 62 and 64 are formed overlying implanted source/drain junction regions 14 and 16, respectively. Sacrificial layers 62 and 64 in the preferred embodiment are formed by a short thermal oxidation process which causes an oxide layer on the order of 50 to 400 angstroms in thickness to be formed. As will be described below, sacrificial layers 62 and 64 provide for a partial masking of implanted source/drain regions 14 and 16 during subsequent process steps.

Figure 9:
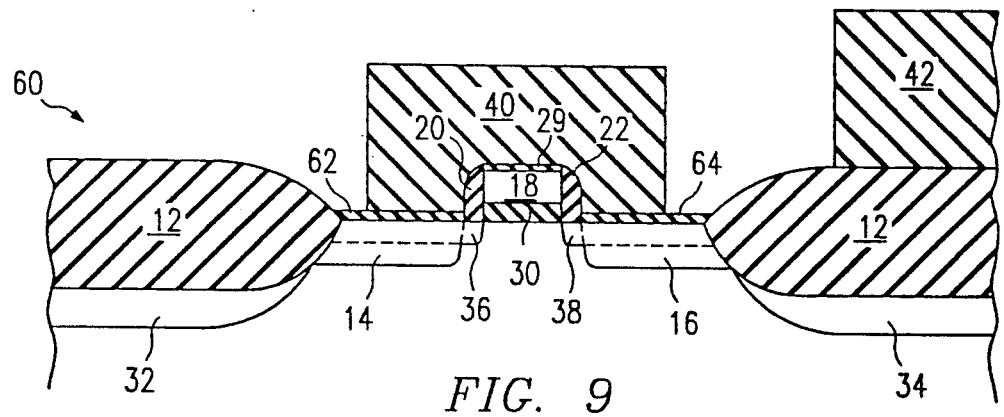
FIG. 9 illustrates a cross-sectional view of the transistor structure having a patterned ion implantation mask formed thereover.

FIG. 9 illustrates a cross-sectional view of transistor structure 60, similar to that shown in FIG. 3. Thus, mask structures 40 and 42 are formed to cover transistor structure 60 except in areas where it is desired to form interconnect regions. Again, mask structures 40 and 42 are preferably formed in one of two ways including: (1) photoresist masking; or (2) hard mask formation.

Figure 10:
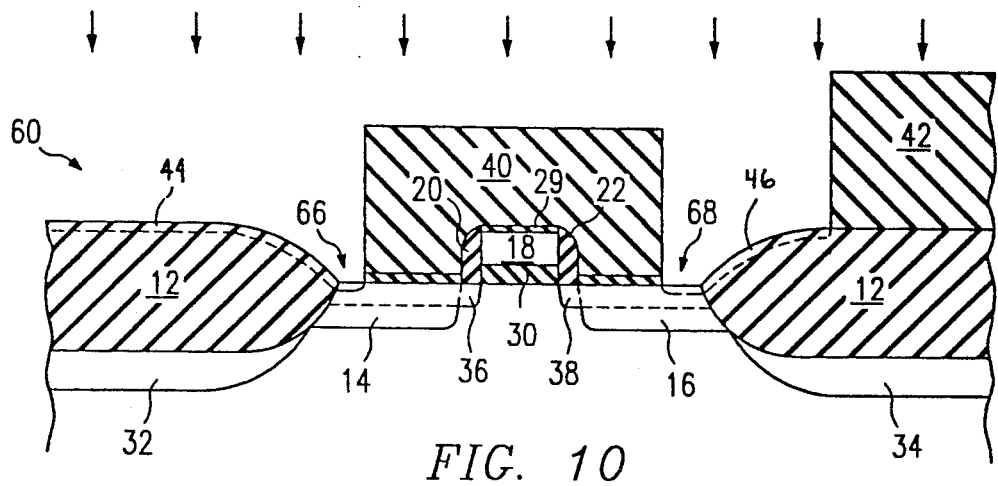
FIG. 10 illustrates a cross-sectional view of the transistor structure being subjected to an ion implantation.

FIG. 10 illustrates a cross-sectional view of transistor structure 60 following the implantation of semiconductor ions. Prior to the implantation step, a selective oxide etch is performed which removes portions of sacrificial layer 62 and 64 between mask structure 40 and field insulating regions 12. Thus, exposed areas 66 and 68 are formed where sacrificial layers 62 and 64 have been partially removed. Following the selective etching of sacrificial layers 62 and 64, semiconductor ions are implanted in the same manner as that discussed above in connection with FIG. 4. Again, this implantation of ions has two effects, including slight surface damage over field insulating regions 12 and the implantation of silicon or germanium atoms near the surface of the unmasked regions of transistor structure 60. Thus, these implanted atoms define loosely-bonded implanted regions 44 and 46 which are rich in unbonded semiconductor atoms.

Figure 11:
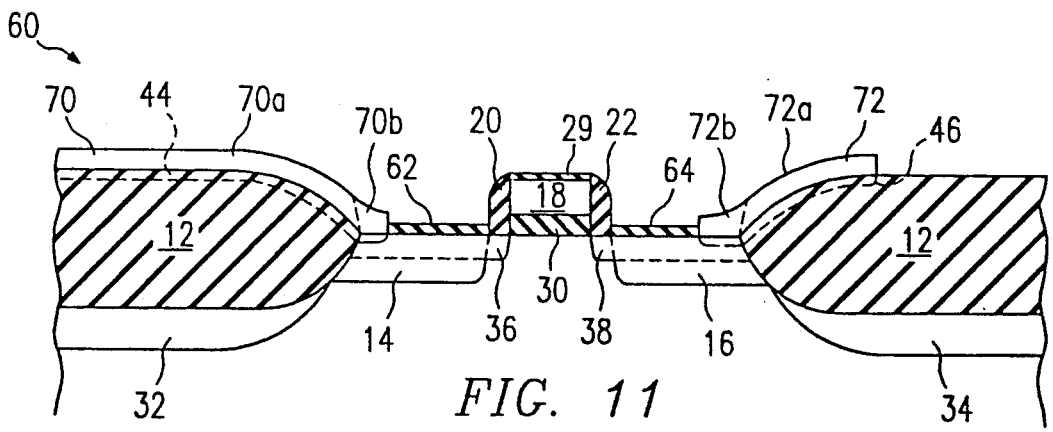
FIG. 11 illustrates a cross-sectional view of the transistor structure having semiconductor interconnect segments formed thereon (by selective semiconductor growth)

FIG. 11 illustrates a cross-sectional view of transistor structure 60 following the formation of interconnect segments 70 and 72 by an SSG process. Interconnect segments 70 and 72, similar to those illustrated in FIG. 5, are each shown including two separate regions designated 70a and 70b and 72a and 72b. The formation of these regions is as follows. Mask structures 40 and 42 are stripped. A selective semiconductor growth (SSG) of undoped or doped semiconductor material is performed. The SSG forms semiconductor regions 70a and 72a over loosely-bonded damaged surface regions 44 and 46, respectively. The SSG further forms semiconductor regions 70b and 72b in exposed source/drain junction areas 66 and 68. It should be noted that the remaining portions of sacrificial layers 62 and 64 mask implanted source/drain regions 14 and 16 so that semiconductor regions 70b and 72b only extend over a slight portion of regions 14 and 16. As will be appreciated below, this masking prevents the formation of an elevated source/drain transistor because no additional SSG-deposited semiconductor material is permitted to form over implanted source/drain junction regions 14 and 16.

Figure 11A:
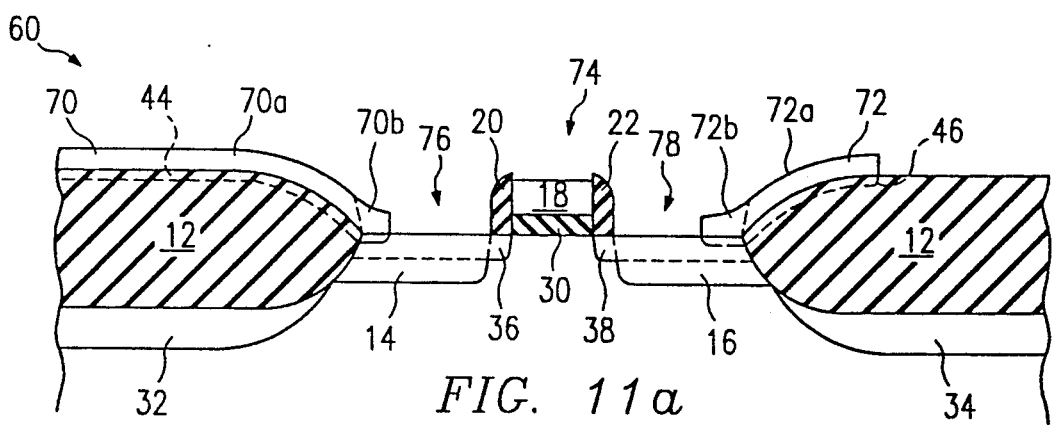
FIG. 11a illustrates a cross-sectional view of the transistor structure following the removal of the dielectric pad and sacrificial layers.

FIG. 11a illustrates a cross-sectional view of transistor structure 70 following the selective removal of dielectric pad 29 and the remaining portions of sacrificial layers 62 and 64. The removal of dielectric pad 29 may be effected in a manner depending on the type of material used for pad 29. For example, in the preferred embodiment, dielectric pad 29 comprises silicon nitride and therefore a nitride etch may be performed in order to remove that pad. Removal of pad 29 defines a cavity 74 over gate conductor 18 and between sidewall spacers 20 and 22. The removal of the remaining portions of sacrificial layers 62 and 64 is accomplished by utilizing a selective removal process directed at the type of material of which layers 62 and 64 are made. Thus, in the preferred embodiment where sacrificial layers 62 and 64 comprise oxide, an oxide etchant is used in order to remove sacrificial layers 62 and 64. Because sacrificial layers 62 and 64 are only on the order of 50 to 400 angstroms in thickness, the removal thereof will only slightly remove portions of oxide sidewall spacers 20 and 22. This reduction in sidewall spacers 20 and 22, however, will have no substantial impact on the operation of transistor structure 60. The removal of sacrificial layers 62 and 64 defines exposed semiconductor surface cavities 76 and 78 in the areas where layers 62 and 64 exist prior to the removal thereof.

Figure 12:
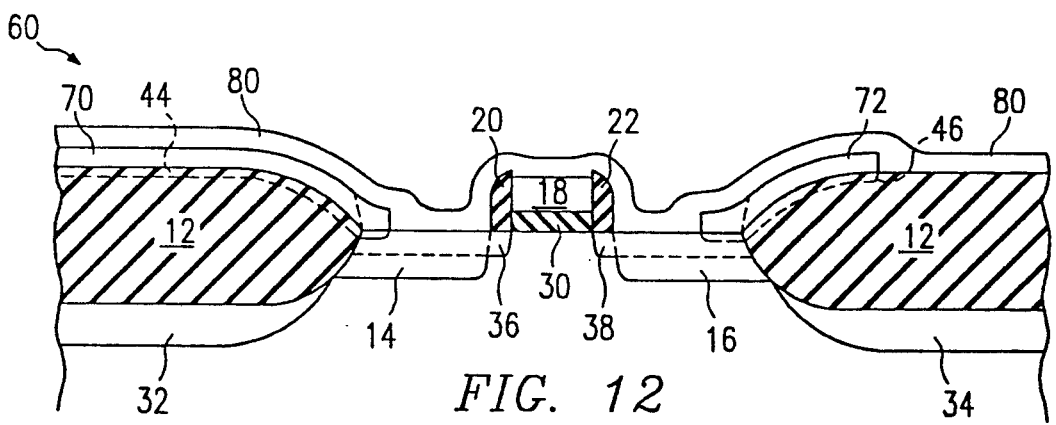
FIG. 12 illustrates a cross-sectional view of the transistor structure following the blanket deposition of a refractory metal layer.

FIG. 12 illustrates a cross-sectional view of transistor structure 60 after a blanket deposition of a refractory metal layer 80. As illustrated, refractory metal layer 80 overlies interconnect segments 70 and 72, and extends within cavities 74, 76 and 78 as well as over the remaining insulating regions of transistor structure 60. As described below, refractory metal layer 80 may be reacted in order to provide contact to selected regions of transistor structure 60 as well as no local interconnect lines.

Figure 13:
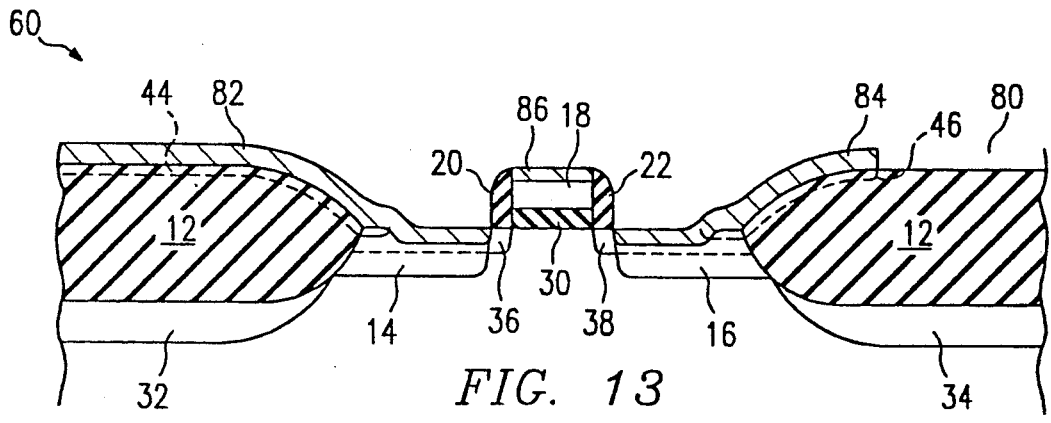
FIG. 13 illustrates a cross-sectional view of the transistor structure having low resistance reacted refractory metal local interconnects and device contacts.

FIG. 13 illustrates a cross-sectional view of transistor structure 60 after the self-aligned formation of reacted refractory metal contacts 82, 84 and 86. Contacts and interconnect lines 82, 84 and 86 are formed in the same manner as that discussed above in connection with FIG. 7. The significant difference with respect to the contacts illustrated in FIG. 13, however, is that contacts 82 and 84 consume, and therefore extend within, implanted source/drain junction regions 14 and 16. Again, a reacted refractory metal contact 86 is formed by consuming a portion of gate conductor 18. It may be appreciated from the perspective of FIG. 13 that the ultimate formation of contacts 82 and 84 results in a non-elevated source/drain transistor. Thus, the process described with respect to FIGS. 8 through 13 provides an alternative method for forming reacted refractory metal contact and local interconnect regions while producing a non-elevated transistor architecture.

Figure 14:
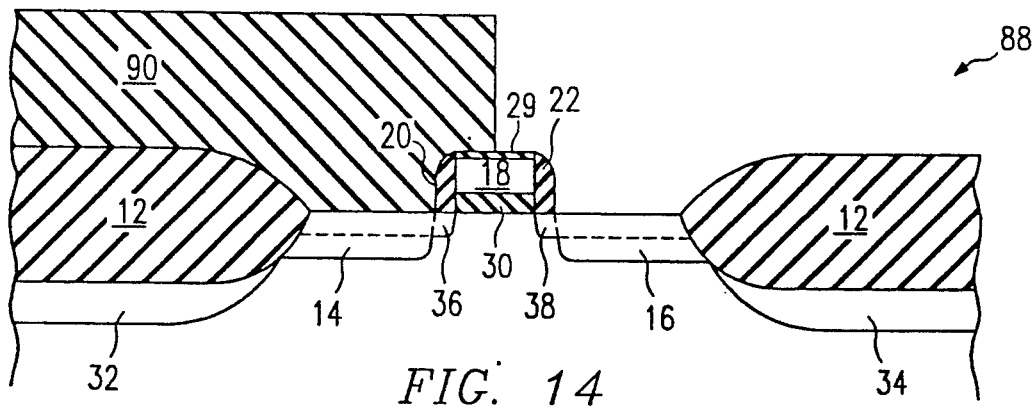
FIG. 14 illustrates a cross-sectional view of an alternative masking structure disposed over a transistor structure.

FIGS. 14 through 18 illustrate cross-sectional views of an implementation of the method of the present invention in order to construct a reacted refractory metal contact between a source/drain junction of a transistor and the gate conductor of that transistor simultaneous with the formation of the local interconnection lines. In particular, FIG. 14 illustrates a cross-sectional view of a transistor structure denoted generally at 88. Transistor structure 88 includes many the same components as those discussed in connection with transistor structures shown in FIGS. 2 and 8 above. Accordingly, similar reference numerals are used within FIG. 14 where similar components exist. Of significant difference, however, is the formation of a mask structure 90 which masks a portion of gate conductor 18, sidewall spacer 20, implanted source/drain junction region 14 and part of field insulation region 12. Mask structure 90 is formed in the same manner as mask structures 40 and 42 discussed above in connection with FIG. 3. The only difference, however, is that a different area of transistor structure 88 is exposed following the formation of mask structure 90. It is in this exposed area where a reacted refractory metal contact will subsequently be formed.

Figure 15:
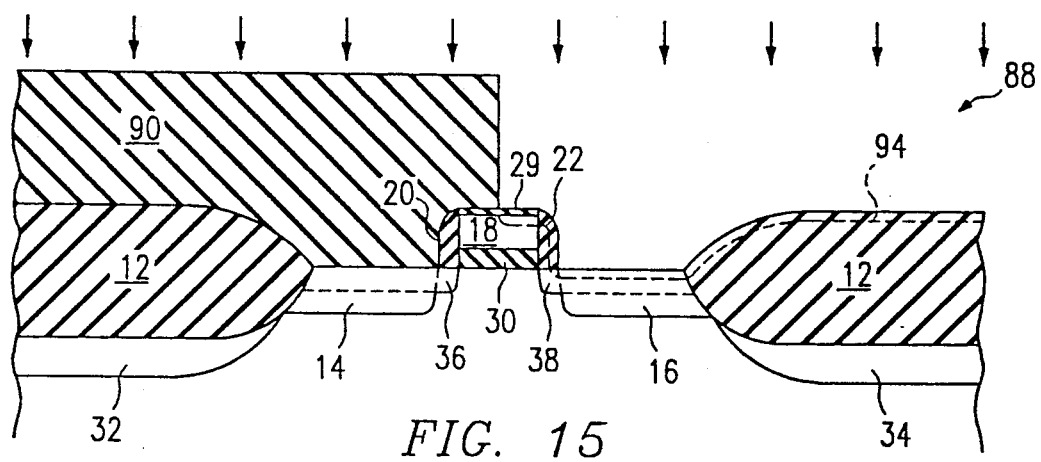
FIG. 15 illustrates a cross-sectional view of the transistor structure being subjected to ion implantation.

FIG. 15 illustrates a cross-sectional view of transistor structure 88 following the implantation of semiconductor ions. The implantation of semiconductor ions is again performed in the same manner discussed above in connection with FIG. 4. Further, the implantation causes the same two effects discussed above (surface damage and implantation of additional surface semiconductor atoms) and defines loosely-bonded damaged surface regions 92 and 94 in sidewall spacer 22 and field insulating region 12, respectively. If necessary, the ion implantation step may be performed using a small tilt angle to effectively implant the exposed sidewall spacers.

Figure 16:
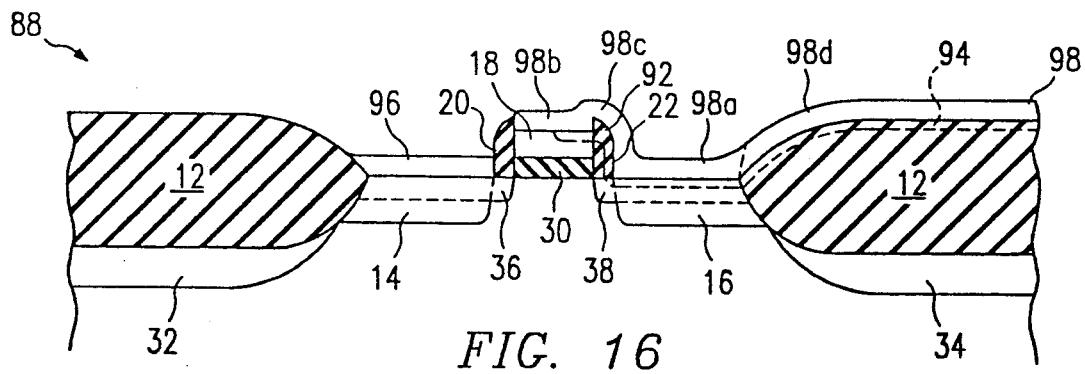
FIG. 16 illustrates a cross-sectional view of a transistor structure following a selective semiconductor growth process.

FIG. 16 illustrates a cross-sectional view of transistor structure 88 following the selective semiconductor growth process. Dielectric pad 29 is removed after removal of implantation mask 90 and prior to the SSG process. An alternative approach is to use a selective etch to remove the exposed portion of dielectric pad 20 prior to removal of implantation mask 90. The SSG forms semiconductor contact and interconnect segments 96 and 98. Segment 96 forms over implanted source/drain junction region 14. Semiconductor interconnect segment 98 is a single semiconductor structure, but is illustrated as four regions. The four regions include elevated source/drain region 98a over implanted source/drain junction region 16, region 98b over gate conductor 18, region 98c over loosely bonded insulating region 92 and 98d over loosely bonded insulating region 94. Each of these regions are separately designated to demonstrate their formation over different components of transistor structure 88.

Figure 17:
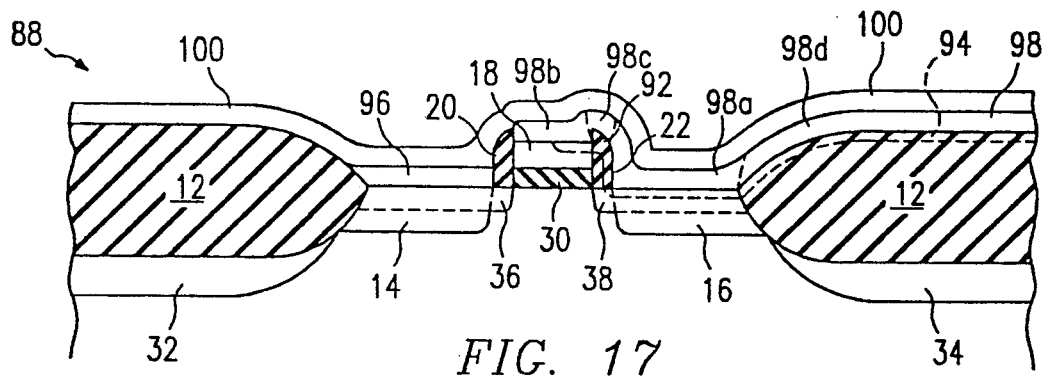
FIG. 17 illustrates a cross-sectional view of a transistor structure following the blanket deposition of a refractory metal layer.

FIG. 17 illustrates a cross-sectional view of semiconductor structure 88 after a blanket deposition of a refractory metal layer 100. As in the other embodiments discussed herein, refractory metal layer 100 is titanium, but alternatively may comprise other metal layers.

Again, refractory metal layer 100 may be reacted as discussed below in order to provide contact to selected regions of transistor structure 88.

Figure 18:
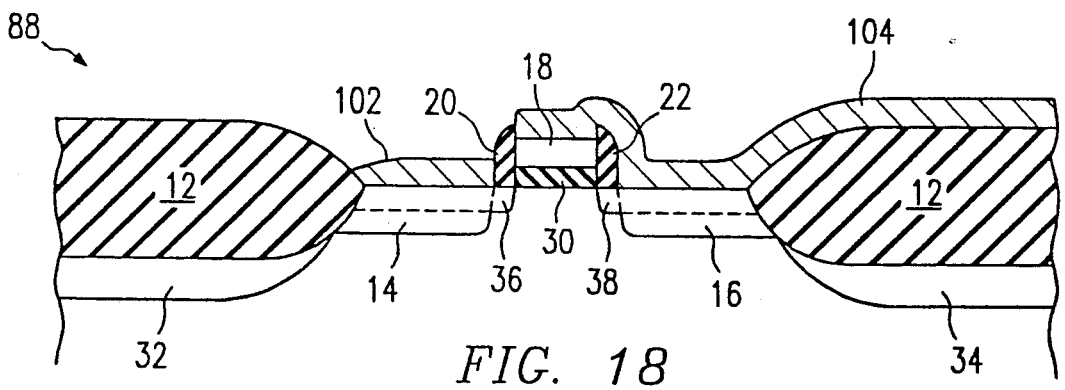
FIG. 18 illustrates a cross-sectional view of a transistor having low resistance reactive refractory metal local interconnects, including an interconnect segment connecting the gate conductor to a source/drain junction region.

FIG. 18 illustrates a cross-sectional view of transistor structure 88 after the formation of reacted refractory metal contacts and interconnect lines 102 and 104. Reacted refractory metal contacts and local interconnect lines 102 and 104 are formed in the same manner as that discussed above in connection with FIG. 7. Again, reacted refractory metal nitride and some unreacted refractory metal (not shown) may be left over the insulating surfaces, including field insulating regions 12 and sidewall spacer 20. After the initial RTA, both unreacted titanium and reacted titanium nitride may be selectively etched and removed as discussed above. Thereafter again, a second RTA may be performed in order to cause reacted refractory metal contacts 102 and 104 to have a lesser electrical resistivity. Thus, from the perspective illustrated in FIG. 18 it may be appreciated that a reacted refractory metal contact may be formed to connect a gate conductor 18 to a source/drain junction region 16 for transistor structure 88 or other devices similar thereto.

Figure 19:
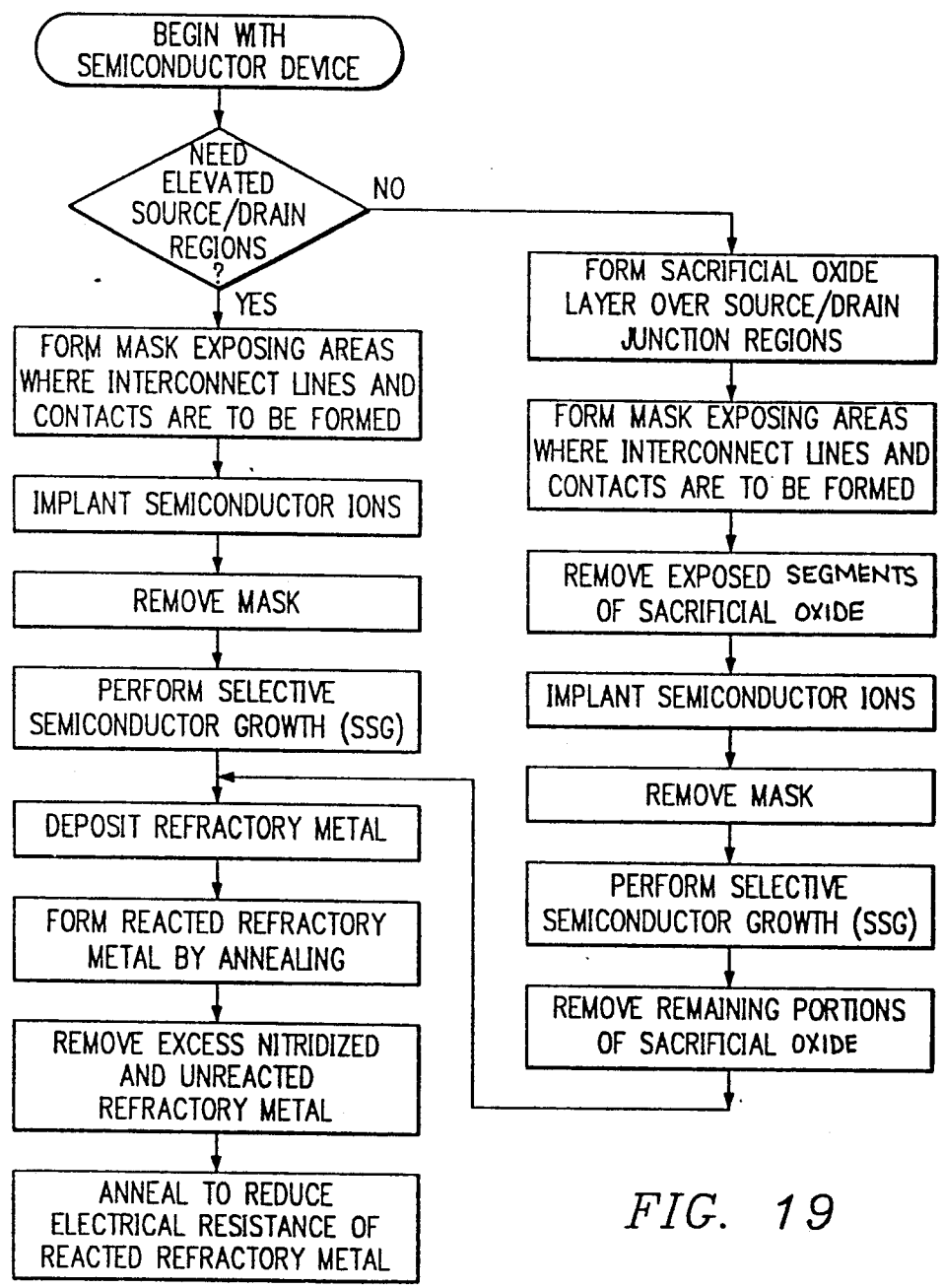
FIG. 19 illustrates a process flow chart describing various sequential fabrication steps implemented in the present invention.

FIG. 19 illustrates a flow chart generally describing the processes discussed above for forming reacted refractory metal contacts and local interconnect lines for both a traditional and elevated source/drain junction transistor. This flow chart is provided for illustrative purposes in order to further enable a person skilled in the art to understand the present invention.

While the current example has shown a cross-sectional view of semiconductor device layout 10, and transistor structures 60 and 88, it should be understood that the invention need not be limited thereto. Indeed, the present invention may be applied to any semiconductor device in order to provide local interconnects either between terminals of a single device, or to interconnect various devices included within a single, or multiple semiconductor layouts. Further, while the present invention has been described in detail, it should be understood that various changes, substitutions and alterations can be made hereto without departing from the spirit and scope of the invention as defined by the appended claims. For example, the step of forming the refractory metal may comprise selectively depositing the refractory metal over the exposed area.

What is claimed is:

1. A method of forming an electrical interconnect over a surface including a semiconductor surface and an insulating surface, comprising the steps of:

covering selected regions of said semiconductor and insulating surfaces with a mask such that an area where the interconnect is to be formed is exposed;

implanting ions into said exposed area such that said insulating surface in said exposed area is disturbed thereby freeing semiconductor atoms;

removing said mask;

forming a semiconductor interconnect region by selectively growing a semiconductor in said semiconductor surface and said insulating surface of exposed regions;

selectively depositing refractory metal over said semiconductor interconnect region; and annealing said refractory metal over said exposed area such that it reacts with said semiconductor interconnect region.

2. The method of claim 1, wherein said step of implanting ions comprises implanting semiconductor ions.

3. The method of claim 1, wherein said step of implanting ions comprises implanting inert ions.

4. The method of claim 2, wherein said step of implanting ions comprises implanting germanium ions.

5. The method of claim 2, wherein said step of implanting ions comprises implanting silicon ions.

6. The method of claim 1, wherein said step of forming a semiconductor interconnect region comprises selectively growing a silicon interconnect region.

7. The method of claim 1, wherein said step of forming a semiconductor interconnect region comprises selectively growing a semiconductor interconnect region.

8. The method of claim 1, wherein said step of forming a semiconductor interconnect region comprises selectively growing a silicon-germanium interconnect region.

9. The method of claim 1, wherein said step of forming a reacted refractory metal contacts and interconnect lines comprises:
   sputtering refractory metal over the exposed area; and
   annealing the refractory metal such that it reacts with the semiconductor interconnect region.

10. The method of claim 9, wherein said step of sputtering refractory metal over the exposed area comprise sputtering titanium.

11. The method of claim 1, wherein said step of forming a reacted refractory metal contact produces excess nitridized refractory metal and unreacted material, and further comprising removing the excess nitridized and unreacted refractory metal material.

12. The method of claim 11 wherein said step of removing comprises isotropically etching the excess nitridized and unreacted refractory metal material.

13. The method of claim 1 wherein said step of forming reacted refractory metal contacts and interconnect lines comprises:
   depositing refractory metal by chemical-vapor deposition over the exposed area; and
   annealing the refractory metal.

14. The method of claim 1 and further comprising annealing the reacted refractory metal contacts and interconnection lines to reduce the electrical resistivity thereof.

15. The method of claim 1 wherein said step of covering with a mask comprises covering with a photoresist mask.

16. The method of claim 1 wherein said step of covering with a mask comprises covering with a hard mask.

17. A method of forming an interconnect over a surface including a semiconductor surface and an insulating surface, comprising the steps of:
   covering a selected region of the surface with a mask such that an area where the interconnect is to be formed is exposed;
   implanting inert ions into the exposed area to create semiconductor nucleation cites in said insulating surface;
   removing the mask;
   selectively growing a semiconductor interconnect region in said semiconductor surface and said insulating surface of the exposed area; and
   forming reacted refractory metal contacts and interconnect lines in the exposed area.

18. The method of claim 17 and further comprising annealing the reacted refractory metal contacts and interconnect lines to reduce the electrical resistivity thereof.

19. The method of claim 17 wherein said step of forming a reacted refractory metal contact comprises:
   sputtering titanium over the exposed area; and
   annealing the refractory metal such that it reacts with the semiconductor interconnect region.

20. The method of claim 17 wherein said step of forming reacted refractory metal contacts and interconnect lines comprises:
   depositing refractory metal by chemical-vapor deposition over the exposed area; and
   annealing the refractory metal.

21. The method of claim 1 wherein said insulating surface is a field oxide.

22. The method of claim 21 wherein said field oxide comprises silicon dioxide.

23. The method of claim 1 wherein said step of selectively growing a semiconductor is performed at temperatures less than or equal to about 900° C.

24. The method of claim 17 wherein said inert ions are selected from the group consisting of argon, helium, and xenon.

25. A method of forming an electrical interconnect over a surface including a semiconductor surface and an insulating surface, comprising the steps of:
   covering selected regions of said semiconductor and insulating surfaces with a mask such that an area where the interconnect is to be formed is exposed;
   implanting ions into said exposed area such that said insulating surface in said exposed area is disturbed thereby freeing semiconductor atoms;
   removing said mask;
   forming a semiconductor interconnect region by selectively growing a semiconductor at least partially comprising germanium in said semiconductor surface and said insulating surface of exposed regions; and
   forming reacted refractory metal contacts and interconnect lines over said semiconductor interconnect region.

26. The method of claim 25 wherein said step of forming a semiconductor interconnect region comprises selectively growing a germanium interconnect region.

27. The method of claim 25 wherein said step of forming a semiconductor interconnect region comprises selectively growing a silicon-germanium interconnect region.

28. The method of claim 25 wherein said step of forming a reacted refractory metal and interconnect line comprises selectively depositing refractory metal over said semiconductor interconnect region; and
   annealing said refractory metal over said exposed area such that it reacts with said semiconductor interconnect region.

* * * * *